United States Patent
Chiou et al.

(10) Patent No.: US 9,390,949 B2
(45) Date of Patent: Jul. 12, 2016

(54) WAFER DEBONDING AND CLEANING APPARATUS AND METHOD OF USE

(75) Inventors: Wen-Chih Chiou, Miaoli (TW);
Yu-Liang Lin, Hsinchu (TW);
Hung-Jung Tu, Hualien (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 422 days.

(21) Appl. No.: 13/306,625

(22) Filed: Nov. 29, 2011

(65) Prior Publication Data

US 2013/0133688 A1  May 30, 2013

(51) Int. Cl.
*H01L 21/02* (2006.01)
*H01L 21/677* (2006.01)
*H01L 21/67* (2006.01)

(52) U.S. Cl.
CPC .... *H01L 21/67173* (2013.01); *H01L 21/02057* (2013.01); *H01L 21/67207* (2013.01)

(58) Field of Classification Search
USPC .................................................. 134/18, 902
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,122,566 A * | 9/2000 | Nguyen et al. | 700/218 |
| 6,184,060 B1 | 2/2001 | Siniaguine | |
| 6,206,441 B1 | 3/2001 | Wen et al. | |
| 6,322,903 B1 | 11/2001 | Siniaguine et al. | |
| 6,342,434 B1 * | 1/2002 | Miyamoto et al. | 438/464 |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,543,988 B2 | 4/2003 | Hsiao et al. | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |

(Continued)

FOREIGN PATENT DOCUMENTS

| | | |
|---|---|---|
| JP | 2014-53465 | 3/2014 |
| TW | 201039297 | 11/2010 |
| TW | 201039298 | 11/2010 |

OTHER PUBLICATIONS

Brewer Science WaferBOND HT-10.10 Temporary Wafer Bonding Material brochure; Aug. 9, 2011.*

(Continued)

*Primary Examiner* — Nicole Blan
*Assistant Examiner* — Natasha Campbell
(74) *Attorney, Agent, or Firm* — Hauptman Ham, LLP

(57) ABSTRACT

This description relates to a wafer debonding and cleaning apparatus including an automatic wafer handling module. The automatic wafer handling module loads a semiconductor wafer into a wafer debonding module for a debonding process. The automatic wafer handling module removes the semiconductor wafer from the debonding module and loads the semiconductor wafer into a wafer cleaning module for a cleaning process.

20 Claims, 3 Drawing Sheets

(56) References Cited

U.S. PATENT DOCUMENTS

| | | | |
|---|---|---|---|
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,100,826 B1* | 9/2006 | Phan et al. | 235/385 |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,364,922 B2* | 4/2008 | Shimizu | 438/5 |
| 7,935,780 B2* | 5/2011 | Hong et al. | 528/350 |
| 2003/0008437 A1 | 1/2003 | Inoue et al. | |
| 2004/0089421 A1* | 5/2004 | Komandur et al. | 156/345.32 |
| 2004/0197179 A1* | 10/2004 | Achkire et al. | 414/618 |
| 2005/0233547 A1* | 10/2005 | Noda et al. | 438/459 |
| 2008/0099149 A1 | 5/2008 | Codding et al. | |
| 2009/0075217 A1 | 3/2009 | Brodsky | |
| 2009/0314438 A1* | 12/2009 | Iwata et al. | 156/584 |
| 2010/0148353 A1 | 6/2010 | Kim et al. | |
| 2010/0263794 A1 | 10/2010 | George et al. | |
| 2010/0330788 A1 | 12/2010 | Yu et al. | |
| 2011/0041764 A1* | 2/2011 | Webb et al. | 118/715 |
| 2011/0146901 A1* | 6/2011 | Hermanowski | 156/249 |
| 2012/0080150 A1* | 4/2012 | Riege et al. | 156/752 |

OTHER PUBLICATIONS

Office Action dated Feb. 20, 2014 from corresponding application No. TW 101112188.

Office Action dated Apr. 22, 2016 and English translation from corresponding No. KR 102015-0097254.

* cited by examiner

WAFER DEBONDING AND CLEANING APPARATUS AND METHOD OF USE

BACKGROUND

To form a three dimensional integrated circuit (3DIC), features are formed on both sides of a semiconductor wafer. In order to form features on a reverse side of the semiconductor wafer, the semiconductor wafer is bonded to a carrier wafer. The carrier wafer permits handling of the semiconductor wafer without damaging the features formed on a front side of the semiconductor wafer. After forming the features on the reverse side, the carrier wafer is debonded from the semiconductor wafer. The debonding process leaves residual bonding material adhered to the front surface of the semiconductor wafer. The wafer is cleaned to remove the residual bonding material before the semiconductor wafer is diced and/or packaged.

The semiconductor wafer has a thickness ranging about 10 µm to about 350 µm. Thin semiconductor wafers require even support across the entire surface of the semiconductor wafer to avoid breaking or warping during transportation between the debonding and cleaning processes. A film frame is positioned to support the semiconductor wafer; however, the use of film frames increases production costs and still results in a significant number of broken or warped semiconductor wafers. The cleaning process for thin semiconductor wafers is performed manually to prevent the chemicals used during cleaning from penetrating between the film frame and the semiconductor wafer and damaging the features formed on the surface of the semiconductor wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

It is understood that the following disclosure provides many different embodiments, or examples, for implementing different features. Specific examples of components and arrangements are described below to simplify the present disclosure. These are, of course, merely examples and are not intended to be limiting.

Figure 1:
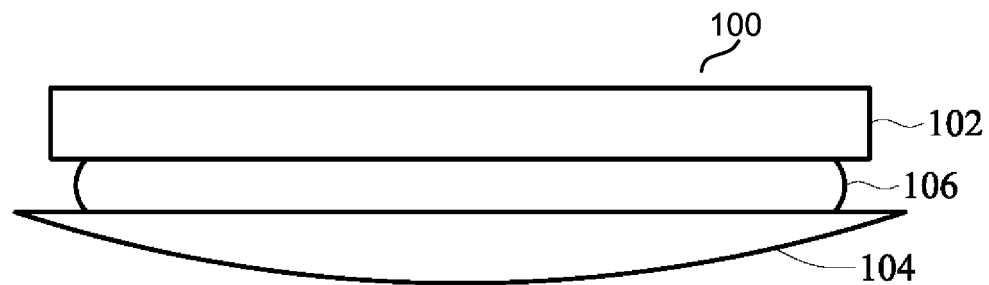
FIG. 1 is a side view of a semiconductor wafer assembly according to an embodiment.

FIG. 1 is a side view of a wafer assembly 100. Wafer assembly 100 includes a semiconductor wafer 102 bonded to a carrier wafer 104 by an adhesive 106. In some embodiments, semiconductor wafer 102 is silicon. In other embodiments, semiconductor wafer 102 is germanium, gallium arsenic, or other suitable semiconductor material. In some embodiments, carrier wafer 104 is sapphire. In other embodiments, carrier wafer 104 is silicon, a thermoplastic polymer, oxide, carbide, or other suitable material. In some embodiments, adhesive 106 is a spin-on adhesive. In other embodiments, adhesive 106 is a laminated tape, wax, or other suitable material.

Figure 2:
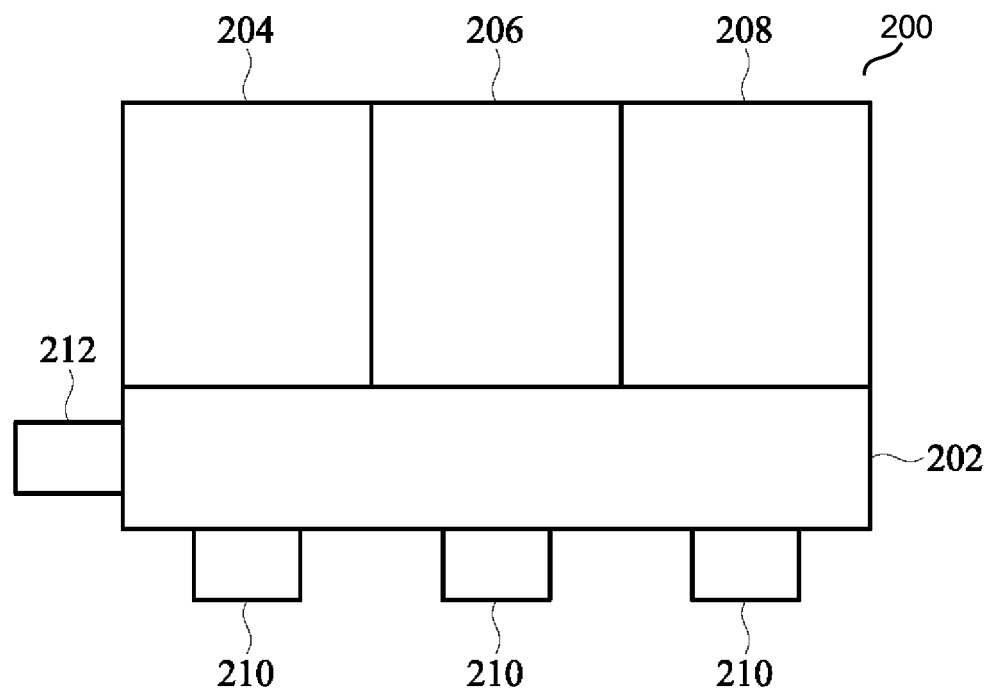
FIG. 2 is a block diagram of a wafer debonding and cleaning apparatus according to an embodiment.

FIG. 2 is a block diagram of a wafer debonding and cleaning apparatus 200 including an automatic wafer handling module 202 for transferring/transporting semiconductor wafer 102 to/from various modules. Wafer debonding and cleaning apparatus 200 also includes a wafer debonding module 204 for separating semiconductor wafer 102 from carrier wafer 104 and two wafer cleaning modules 206 and 208 for removing adhesive 106 from semiconductor wafer 102. Wafer debonding and cleaning apparatus further includes storage units 210 for storing multiple semiconductor wafers 102 or wafer assemblies 100. A scanning module 212 scans barcodes on semiconductor wafer 102 for tracking purposes. In some embodiments, wafer debonding and cleaning apparatus 200 may be integrated into a single apparatus. In other embodiments, wafer debonding and cleaning apparatus may be separating into different apparatuses. One of ordinary skill in the art would recognize as the distance between apparatuses increases the time to transport wafer assembly 100 or semiconductor wafer 102 to/from the different apparatuses increases.

Figure 3A:
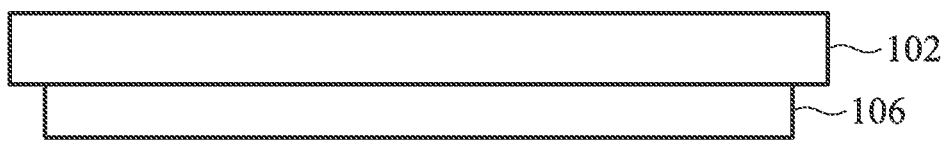
FIG. 3A-3B are side views of a semiconductor wafer at various stages of processing according to an embodiment.
Figure 3B:

Manually transporting wafer assemblies can result in an increase in wafer assembly breakage and warping due to human error. Wafer assembly breakage occurs when semiconductor wafer 102 is fractured. Automatic wafer handling module 202 removes the need for manual transportation of the wafer assembly thus increasing production yield and decreased production cost. In some embodiments, the automatic wafer handling module is a robotic arm. In some embodiments, automatic wafer handling module 202 includes multiple robotic arms. The robotic arm has a blade portion configured to support the semiconductor wafer 102 or wafer assembly 100. In some embodiments, the blade portion includes sensors to enhance the positioning of the blade portion with respect to semiconductor wafer 102 or wafer assembly 100 (FIG. 1) to prevent scratching a surface of semiconductor wafer 102 (FIGS. 1 and 3A-3B). In some embodiments, the blade portion is substantially U-shaped to minimize the amount of contact between the blade portion and the wafer assembly. In other embodiments, the blade portion is circular, rectilinear or another suitable shape for supporting and moving semiconductor wafer 102 wafer assembly 100.

The blade portion does not need to evenly support the entire surface of the wafer assembly because semiconductor wafer 202 (FIG. 2A-2C) has a thickness ranging from about 350 µm to about 1500 µm. This range, in some embodiments, is narrower, e.g., from 350 µm to 1500 µm. Semiconductor wafer 102 has enhanced mechanical strength capable of withstanding the debonding and cleaning processes without significant risk of warping or fracture due to the larger thickness.

Automatic wafer handling module 202 loads wafer assembly 100 (FIG. 1), into wafer debonding module 204. Following loading, wafer assembly 200 is transferred to a debonding stage. On the debonding stage, wafer assembly 100 is irradiated to weaken an adhesive 106 bonding semiconductor wafer 102 and carrier wafer 104. In some embodiments, wafer assembly 100 is irradiated with ultraviolet light. In other embodiments, wafer assembly 100 is irradiated with laser light, thermal energy or other suitable types of energy to weaken the bond between carrier wafer 104 and semiconductor wafer 102. Following irradiation, wafer assembly 100 is transferred off the debonding stage and carrier wafer 104 is lifted off semiconductor wafer 102. In some embodiments, a portion of adhesive 106 remains attached to each of semiconductor wafer 102 and carrier wafer 104. Carrier wafer 104 is cleaned and stored for use with another semiconductor wafer. Following the debonding process, semiconductor wafer 102 resembles the structure shown in FIG. 3A.

Automatic wafer handling module 202 removes semiconductor wafer 102 from wafer debonding module 204 following removal of the carrier wafer 104. Automatic wafer handling module 202 then transfers semiconductor wafer 102, shown in FIG. 3A, to a cleaning module 206 or 208.

After semiconductor wafer 102 is loaded into the cleaning module 206 or 208, semiconductor wafer 102 (FIG. 3A) is positioned on a cleaning stage. The cleaning stage is configured to rotate, e.g., by the use of a motor, semiconductor wafer 102. In some embodiments, a nozzle positioned above the cleaning stage supplies a solvent solution onto the surface of semiconductor wafer 102 bonded to residual adhesive 106. In an embodiment, the solvent solution is a mixture of deionized water, tetramethylammonium hydroxide (TMAH), potassium hydroxide (KOH), methylpyrrolidone (NMP), isopropanol (IPA), ethanol, acetone, hydrogen peroxide ($H_2O_2$) and dimethyl sulfoixde (DMSO). In some embodiments, cleaning module 206 or 208 further includes brushes to help remove residual adhesive 106 from semiconductor substrate 106. Some embodiments of cleaning module 206 or 208 use the nozzle to spray high pressure air or liquid onto semiconductor wafer 102 to remove residual adhesive 106. Other embodiments of the cleaning module 206 or 208 use the nozzle to introduce different chemicals onto semiconductor wafer 102 to chemically remove residual adhesive 106 from semiconductor wafer 102. Following completion of the wafer cleaning process, residual adhesive 106 is sufficiently removed from semiconductor wafer 102 for further processing, e.g., packing and dicing, as shown in FIG. 3B. Automatic wafer handling module 202 removes semiconductor wafer 102 from cleaning module 206 or 208.

Wafer debonding and cleaning apparatus 200 includes a second cleaning module 208. The cleaning process requires more time than the wafer debonding process. By including second cleaning module 208, wafer debonding and cleaning apparatus 200 increases efficiency by eliminating a production bottleneck at the wafer cleaning process. Automatic wafer handling module 202 is equipped with a control system (not shown) to determine which cleaning module to use. The control system connects to cleaning modules 206 and 208 and to automatic wafer handling module 202 and determines whether either cleaning module is available to accept semiconductor wafer 102 (FIG. 3A).

In some embodiments, automatic wafer handling module 202 places a wafer assembly 100 or a semiconductor wafer 102 in one of storage units 210 when the wafer assembly 100 or the semiconductor wafer 102 is not in either debonding module 204 or cleaning modules 206 or 206. Storage units 210 include support arrangements designed to support a plurality of wafer assemblies 100 or semiconductor wafers 102. The spacing between wafer assemblies is sufficient to allow the automatic wafer handling module 202 to insert and remove wafer assemblies 200 or semiconductor wafers 102 without contacting adjacent wafer assemblies or semiconductor wafers to avoid damaging stored wafers.

In one embodiment, storage units 210 are stationary. In a wafer debonding and cleaning apparatus 200 which has stationary storage units 210, automatic wafer handling module 202 removes wafer assembly 100 or semiconductor wafer 102 from a first storage unit and loads the wafer assembly or semiconductor wafer into a module 204, 206 or 208. After completion of the process in module 204, 206 or 208 automatic wafer handling module 202 places wafer assembly 100 or semiconductor wafer 102 in a second storage unit 210 different from the first storage unit 210 in order to move the wafer assemblies or semiconductor wafers further along the processing line. For example, after automatic wafer handling module 202 removes wafer assembly 100 from first storage unit 210 and loads the wafer assembly into wafer debonding module 204. Automatic wafer handling module 202 then removes semiconductor wafer 102 from debonding module 204 and places the semiconductor wafer in a second storage unit 210 closer to cleaning module 206 or 208.

In another embodiment, storage units 210 are movable, e.g., front opening unified pods (FOUPs), and transfer wafer assemblies 100 or semiconductor wafers 102 in groups from a present location to a new location. The new location is either adjacent a different module in wafer debonding and cleaning apparatus 200 or to another apparatus, such as a dicing or packaging apparatus. In a wafer debonding and cleaning apparatus 200 which has movable storage units 210, automatic wafer handling module 202 removes a wafer assembly 100 or semiconductor wafer 102 from storage unit 210 and loads the wafer assembly or the semiconductor wafer into a module 204, 206 or 208 and returns the wafer assembly or the semiconductor wafer back to the same storage unit 210 following completion of the process in the module 204, 206 or 208. Storage unit 210 then moves the wafer to a new location.

In still another embodiment, automatic wafer handling module 202 includes a robotic arm associated with each module 204, 206 and 208 and storage units 210 are movable. Each robotic arm removes wafer assembly 100 or semiconductor wafer 102 from a storage unit 210 and loads the wafer assembly or the semiconductor wafer into the associated module 204, 206 or 208. After the module processing is completed, the associated robotic arm removes wafer assembly 100 or semiconductor wafer 102 from the module 204, 206 or 208 and stores the wafer assembly or the semiconductor wafer in the same storage unit 210. Movable storage units 210 transfer wafer assemblies 100 or semiconductor wafers 102 between locations near each module 204, 206 and 208, to allow robotic arms associated with each module 204, 206 or 208 to continue loading and removing wafer assemblies 100 or semiconductor wafers 102 without having to transfer the wafer assemblies or the semiconductor wafers between modules.

Wafer debonding and cleaning apparatus 200 includes a wafer scanner 212 for scanning a barcode attached to each semiconductor wafer 102 prior to processing. Wafer scanner 212 scans the barcode upon semiconductor wafer 102 entering the wafer debonding and cleaning apparatus 200. Wafer scanner 212 transmits the scanned barcode to a computer system to allow tracking of semiconductor wafers 102 throughout the production process. The ability to track semiconductor wafers 102 throughout the production process allows production errors to be located and corrected rapidly.

Figure 4:
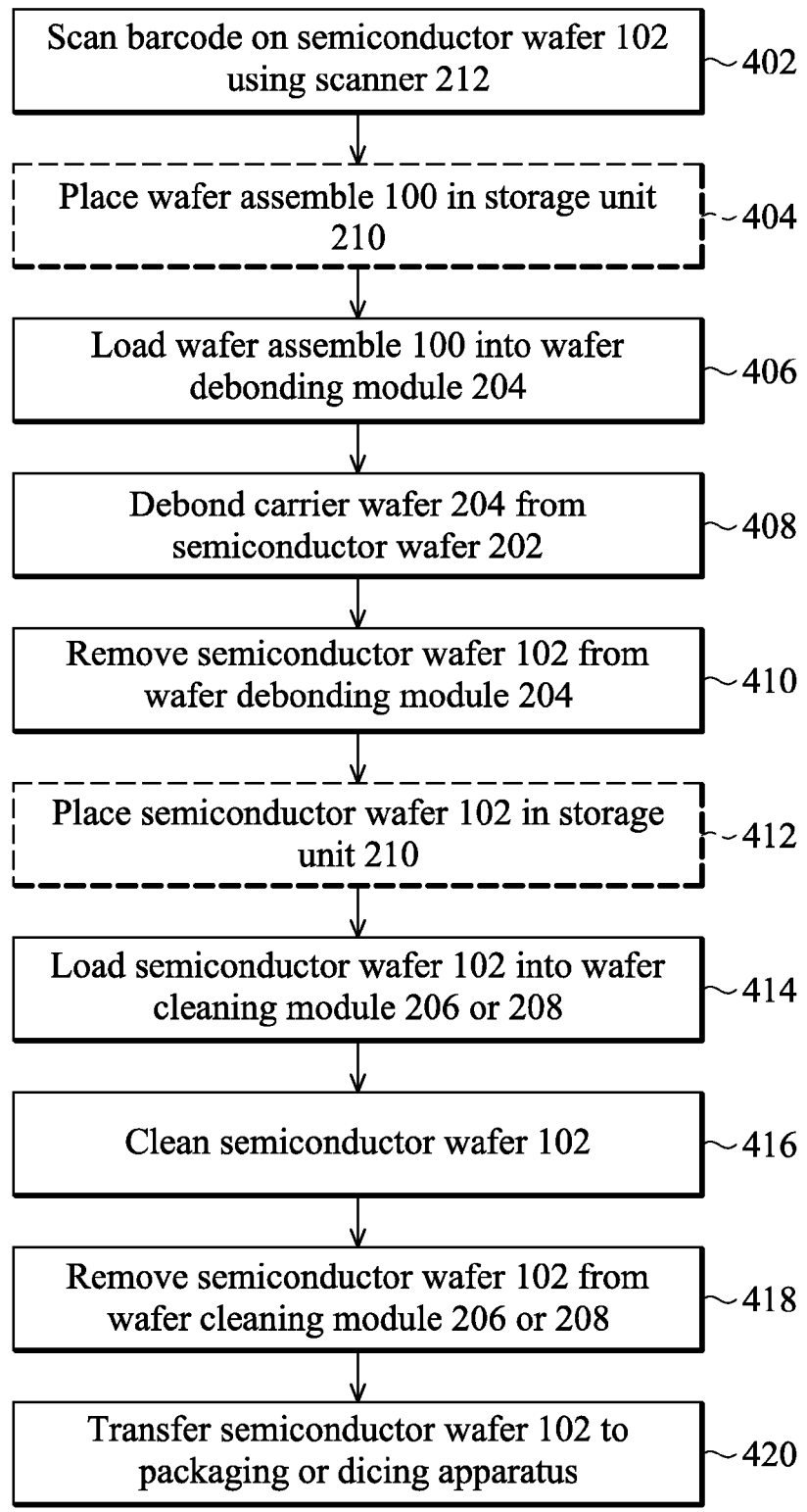
FIG. 4 is a flow chart of a method of using the wafer debonding and clean apparatus according to an embodiment.

FIG. 4 is a flow chart of a method 400 of using wafer debonding and cleaning apparatus 200 according to an embodiment. Method 400 begins with step 402 in which the barcode on the semiconductor wafer 102 is scanned by wafer scanner 212. Step 404 is an optional step, in which automatic wafer handling module 202 places wafer assembly 100 into a storage unit 210.

In step 406, automatic wafer handling module 202 loads wafer assembly 100 (FIG. 1), into wafer debonding module 204. If optional step 404 is included, automatic wafer handling module 202 removes wafer assembly 100 from storage unit 210 and loads wafer assembly 100 into wafer debonding module 204. If optional step 404 is not included, automatic wafer handling module 202 transfers wafer assembly 100 directly from wafer scanner 212 to wafer debonding module 204.

In step 408, wafer debonding module 204 debonds carrier wafer 104 from semiconductor wafer 102. Following the debonding process, semiconductor wafer 102 (FIG. 3A), is removed from wafer debonding module 204 and carrier wafer 104 is cleaned and stored for use with subsequent wafer assemblies, in step 410.

In an optional step 412, automatic wafer handling module 202 transfers the semiconductor wafer 102 to a storage unit 210. In step 414, automatic wafer handling module 202 loads the semiconductor wafer 102 (FIG. 3A), into wafer cleaning module 206 or 208. If optional step 412 is included, automatic wafer handling module 202 removes semiconductor wafer 102 from storage unit 210 and loads the semiconductor wafer into wafer cleaning module 206 or 208. If optional step 412 is not included, automatic wafer handling module 202 takes semiconductor wafer 102 directly from wafer debonding module 204 to wafer cleaning module 206 or 208. The control system (not shown) connected to automatic wafer handling module 202 and wafer cleaning modules 206 and 208 determines to which wafer cleaning module 206 or 208, semiconductor wafer 102 is transferred.

In step 416, semiconductor wafer 102 is cleaned in wafer cleaning module 206 or 208, to produce semiconductor wafer 102 (FIG. 3B). Following the cleaning process, semiconductor wafer 102 is removed from wafer cleaning module 206 or 208, in step 418.

In step 420, semiconductor wafer 102 is sent to a packaging or dicing apparatus for further processing of the semiconductor wafer 102. If wafer debonding and cleaning apparatus 200 includes movable storage units 210, semiconductor wafer 102 is placed in the storage unit 210 and storage unit 210 is transferred to the packaging or dicing apparatus. If wafer debonding and cleaning apparatus 200 includes stationary storage units 210, semiconductor wafer 102 is placed on a conveyor, a separate movable storage unit or some other device for transporting semiconductor wafer 102 to the dicing and/or packaging device.

One aspect of the description relates to a wafer debonding and cleaning apparatus including an automatic wafer handling module, a wafer debonding module, and a wafer cleaning module, where the automatic wafer handling module loads a semiconductor wafer into the wafer debonding module and the wafer cleaning module. Another aspect of the description relates to a method of debonding and cleaning a wafer including loading a semiconductor wafer bonded to a carrier wafer into a wafer debonding module using an automatic wafer handling module, separating the semiconductor wafer from the carrier wafer, removing the semiconductor wafer from the wafer debonding module using the automatic wafer handling module, loading the semiconductor wafer into a wafer cleaning module using the automatic wafer handling module, cleaning a surface of the semiconductor wafer using the wafer cleaning module and removing the semiconductor wafer from the wafer cleaning module using the automatic wafer handling module.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of debonding and cleaning a wafer, the method comprising:
   separating a semiconductor wafer from a carrier wafer using a wafer debonding module;
   cleaning a surface of the semiconductor wafer using one wafer cleaning module of two wafer cleaning modules; and
   transferring the semiconductor wafer to/from the wafer debonding module and the wafer cleaning module used to clean the surface of the semiconductor wafer using an automatic wafer handling module;
   transferring the semiconductor wafer to a storage unit using the automatic wafer handling module if the wafer cleaning modules are determined as not available; and
   monitoring the availability of the wafer cleaning modules,
   wherein the semiconductor wafer is transferred from the storage unit to the wafer cleaning module used to clean the surface of the semiconductor wafer when the wafer cleaning module used to clean the surface of the semiconductor wafer is determined to be available, and a quantity of the wafer cleaning modules is greater than a quantity of wafer debonding modules.

2. The method of claim 1, wherein the semiconductor wafer has a thickness ranging from about 350 µm to about 1500 µm.

3. The method of claim 1, further comprising supporting the semiconductor wafer, by the automatic wafer handling module using a robotic arm configured to support the semiconductor wafer without the use of a film frame.

4. The method of claim 1, wherein the step of separating the semiconductor wafer from the carrier wafer comprises exposing an adhesive bonding the semiconductor wafer to the carrier wafer to ultraviolet radiation or laser light.

5. The method of claim 1, wherein the step of cleaning a surface of the wafer comprises washing the surface of the wafer with a solution including dimethyl sulfoxide and deionized water.

6. The method of claim 1, further comprising placing the semiconductor wafer in a storage unit, by the automatic wafer handling module, after removing the semiconductor wafer from the wafer debonding module or the wafer cleaning module used to clean the surface of the wafer.

7. The method of claim 1, further comprising removing the semiconductor wafer from a storage unit, by the automatic wafer handling module, prior to loading the semiconductor wafer into the wafer debonding module or the wafer cleaning used to clean the surface of the wafer.

8. The method of claim 1, further comprising scanning a barcode associated with the semiconductor wafer and transmitting the scanned barcode to a computer system.

9. The method of claim 1, further comprising transferring the semiconductor wafer to different locations, by a movable storage unit.

10. The method of claim 9, wherein the movable storage unit is configured to accommodate a plurality of semiconductor wafers, the semiconductor wafer cleaned by the wafer cleaning module of the two wafer cleaning modules is a semiconductor wafer of the plurality of semiconductor wafers, and the method further comprises:
    cleaning at least one other semiconductor wafer of the plurality of semiconductor wafers using a second wafer cleaning module of the two wafer cleaning modules.

11. The method of claim 10, further comprising determining, by a control system, which semiconductor wafer of the plurality of semiconductor wafers is cleaned by the wafer cleaning module or the other wafer cleaning module.

12. A method of debonding and cleaning a wafer, the method comprising:
- loading a wafer assembly into a debonding tool using an automatic wafer handling module having a control system, the wafer assembly comprising a wafer bonded to a carrier by an adhesive;
- debonding the carrier from the wafer;
- transferring the debonded wafer to one cleaning tool of two cleaning tools using the automatic wafer handling module;
- transferring the debonded wafer to a storage unit using the automatic wafer handling module if the cleaning tools are determined as not available;
- monitoring the availability of the cleaning tools; and
- removing the adhesive from the debonded wafer using the one cleaning tool of the two cleaning tools,
- wherein the debonded wafer is transferred from the storage unit to the cleaning tool used to remove the adhesive from the debonded wafer when the cleaning tool used to clean the surface of the wafer is determined to be available, and a quantity of the cleaning tools is greater than a quantity of wafer debonding modules.

13. The method of claim 12, wherein removing the adhesive comprises exposing the adhesive to a solvent solution, the solvent solution being a mixture of deionized water, tetramethylammonium hydroxide (TMAH), potassium hydroxide (KOH), methylpyrrolidone (NMP), isopropanol (IPA), ethanol, acetone, hydrogen peroxide, and dimethyl sulfoxide (DMSO).

14. The method of claim 12, further comprising tracking a location of the wafer by scanning a barcode attached to the wafer.

15. The method of claim 12, wherein debonding the carrier from the wafer comprises irradiating the adhesive with electromagnetic radiation.

16. A method of debonding and cleaning a wafer, the method comprising:
- loading a first wafer assembly into a debonding tool using an automatic wafer handling module having a control system, the first wafer assembly comprising a first wafer bonded to a first carrier by a first adhesive;
- performing a debonding process on the first wafer assembly using the debonding tool;
- transferring the debonded first wafer to one of a first cleaning tool or a second cleaning tool of two cleaning tools using the automatic wafer handling module;
- performing a first cleaning process on the debonded first wafer using the first cleaning tool or the second cleaning tool to remove the first adhesive;
- loading a second wafer assembly into the debonding tool using the automatic wafer handling module, the second wafer assembly comprising a second wafer bonded to a second carrier by a second adhesive;
- performing the debonding process on the second wafer assembly using the debonding tool;
- transferring the debonded second wafer to the first cleaning tool or the second cleaning tool of the two cleaning tools using the automatic wafer handling module;
- performing a second cleaning process on the debonded second wafer using the first cleaning tool or the second cleaning tool to remove the second adhesive;
- transferring the debonded first wafer or the debonded second wafer to a storage unit using the automatic wafer handling module if the first cleaning tool and the second cleaning tool are determined as not available;
- monitoring the availability of the first cleaning tool and the second cleaning tool; and
- transferring the debonded first wafer or the debonded second wafer from the storage unit to the first cleaning tool or the second cleaning tool when the first cleaning tool or the second cleaning tool is determined to be available,
- wherein a quantity of the cleaning tools is greater than a quantity of wafer debonding modules.

17. The method of claim 16, wherein performing the debonding process comprises performing the debonding process for a first duration, and performing the first cleaning process comprises performing the first cleaning process for a second duration longer than the first duration.

18. The method of claim 16, wherein transferring the debonded second wafer to the second cleaning tool comprises:
- determining an availability of the first cleaning tool and the second cleaning tool; and
- transferring the debonded second wafer to the second cleaning tool if the first cleaning tool is not available and the second cleaning tool is available.

19. The method of claim 16, wherein transferring the debonded first wafer or the debonded second wafer to a storage unit comprises:
- transferring the debonded first wafer to a first storage unit that corresponds with the first cleaning tool; and
- transferring the debonded second wafer to a second storage unit different from the first storage unit,
- wherein the second storage unit corresponds to the second cleaning tool.

20. The method of claim 19, wherein the first storage unit and the second storage unit are movable between the debonding tool and the first cleaning tool or the second cleaning tool.

* * * * *